(12) United States Patent
Berasain Balda et al.

(10) Patent No.: US 11,561,264 B2
(45) Date of Patent: Jan. 24, 2023

(54) DETECTING DEVICE AND METHOD FOR DETECTING A FAULT IN A TRANSFORMER OF A WIND TURBINE

(71) Applicant: Siemens Gamesa Renewable Energy Innovation & Technology S.L., Sarriguren (ES)

(72) Inventors: José Ignacio Berasain Balda, Navarra (ES); Héctor Morato González, Madrid (ES); Samuel Ortiz Delgado, Navarra (ES); Didier Velez Castellano, Oviedo, FL (US)

(73) Assignee: SIEMENS GAMESA RENEWABLE ENERGY INNOVATION & TECHNOLOGY S.L.

( * ) Notice: Subject to any disclaimer, the term of this patent is extended or adjusted under 35 U.S.C. 154(b) by 93 days.

(21) Appl. No.: 17/286,582

(22) PCT Filed: Sep. 12, 2019

(86) PCT No.: PCT/EP2019/074321
§ 371 (c)(1),
(2) Date: Apr. 19, 2021

(87) PCT Pub. No.: WO2020/083560
PCT Pub. Date: Apr. 30, 2020

(65) Prior Publication Data
US 2021/0389385 A1 Dec. 16, 2021

(30) Foreign Application Priority Data

Oct. 22, 2018 (EP) .................................... 18380009

(51) Int. Cl.
*G01R 31/62* (2020.01)
*H02H 7/04* (2006.01)
(Continued)

(52) U.S. Cl.
CPC ............. *G01R 31/62* (2020.01); *G01R 31/40* (2013.01); *H02H 1/0007* (2013.01); *H02H 7/04* (2013.01); *H02H 7/06* (2013.01)

(58) Field of Classification Search
CPC ...... G01R 31/62; G01R 31/40; H02H 1/0007; H02H 7/06; H02H 7/04
See application file for complete search history.

(56) References Cited

U.S. PATENT DOCUMENTS 8,698,334 B2 * 4/2014 Bo ............................. H02J 3/26
290/44
9,461,572 B2 * 10/2016 Wessels ................... H02P 23/26
(Continued)

FOREIGN PATENT DOCUMENTS

CN 103 278 773 A 9/2013
CN 108 414 821 A 8/2018
(Continued)

OTHER PUBLICATIONS

European Search Report and Written Opinion of the European Searching Authority dated Apr. 16, 2019 for Application No. 18380009.3.
(Continued)

*Primary Examiner* — Scott Bauer
(74) *Attorney, Agent, or Firm* — Schmeiser, Olsen & Watts LLP

(57) ABSTRACT

Provided is a detecting device and a method for detecting a fault in a transformer of a wind turbine, wherein the transformer transforms a lower voltage, which is output from a generator of the wind turbine to a low voltage side of the transformer, to a higher voltage, which is output from the transformer at a high voltage side, the detecting device including: a voltage detection device configured to detect a voltage at a first node at the low voltage side of the transformer; a current detection device configured to detect
(Continued)

a current at a second node at the high voltage side of the transformer. The detecting device is configured to detect the fault in the transformer based on the detected voltage and the detected current.

14 Claims, 3 Drawing Sheets

(51) Int. Cl.
    *G01R 31/40* (2020.01)
    *H02H 1/00* (2006.01)
    *H02H 7/06* (2006.01)

(56) References Cited

U.S. PATENT DOCUMENTS

| | | | | |
|---|---|---|---|---|
| 2006/0290330 | A1* | 12/2006 | Harris | H02M 3/33507 323/222 |
| 2010/0188240 | A1 | 7/2010 | Wells | |
| 2011/0317460 | A1* | 12/2011 | Garces Rivera | H02M 7/48 333/175 |
| 2014/0002937 | A1* | 1/2014 | Tausa | H02H 3/283 361/76 |
| 2016/0020601 | A1* | 1/2016 | Vijayaganesh | H02H 7/28 361/63 |
| 2016/0285273 | A1* | 9/2016 | Leinonen | H02J 3/1842 |
| 2019/0137568 | A1* | 5/2019 | Freire | F03D 17/00 |

FOREIGN PATENT DOCUMENTS

| | | |
|---|---|---|
| EP | 1 527 505 A2 | 5/2005 |
| JP | 2000078754 A | 3/2000 |
| WO | WO2004008600 A2 | 1/2004 |

OTHER PUBLICATIONS

PCT International Search Report & Written Opinion dated Dec. 6, 2019 corresponding to PCT International Application No. PCT/EP2019/074321.

\* cited by examiner

DETECTING DEVICE AND METHOD FOR DETECTING A FAULT IN A TRANSFORMER OF A WIND TURBINE

CROSS-REFERENCE TO RELATED APPLICATIONS

This application claims priority to PCT Application No. PCT/EP2019/074321, having a filing date of Sep. 12, 2019, which is based on EP Application No. 18380009.3, having a filing date of Oct. 22, 2018, the entire contents both of which are hereby incorporated by reference.

FIELD OF TECHNOLOGY

The following relates to the field of wind turbines. A conventional wind turbine comprises a plurality of elements including a tower, a nacelle mounted to the tower and a rotor having a plurality of blades rotatable mounted to the nacelle. The wind turbine further comprises a generator which generates an AC voltage by a rotational movement of the rotor. A transformer transforms a voltage from one level to another level, for example a low voltage generated by the generator to a higher voltage. The higher voltage is also called as "medium voltage". A medium voltage" is a commonly known voltage between 1 kV and 36 kV.

BACKGROUND

In particular, embodiments of the present invention relate to a detecting device and a method of detecting a fault in the transformer of a wind turbine.

SUMMARY

An aspect relates to a low-cost detecting device which enables reliable detection of faults occurring in the transformer.

According to a first aspect of embodiments of the invention, a detecting device for detecting a fault in a transformer of a wind turbine is provided, wherein the transformer transforms a voltage from one level to another level, for example a lower voltage, which is output from a generator of the wind turbine at a low voltage side of the transformer, to a higher voltage, which is output from the transformer at a high voltage side. The detecting device comprises a voltage detection device configured to detect a voltage at a first node at the low voltage side of the transformer; and a current detection device configured to detect a current at a second node at the high voltage side of the transformer. The detecting device is configured to detect the fault in the transformer based on the detected voltage and the detected current. The control device comprises a logic circuit, wherein the control device is configured to open the line switch if the logic circuit detects at least one of the following conditions: an open phase at the low voltage side if the voltage detection device detects a zero-sequence voltage or a zero-sequence voltage exceeding a particular threshold, and a voltage unbalance; and an open phase at the high voltage side if the voltage detection device detects no zero-sequence voltage or a zero-sequence voltage falling below a particular threshold, and a voltage unbalance.

There can be a voltage difference between the neutral points, which is referred to as the zero sequence voltage as a known terminus technicus. The amount thereof depends on the inequality of impedances in the grid.

In a balanced multiple phase system, the phase voltages are substantially equal. Inequality of the phase voltages results in a voltage unbalance as a known terminus technicus, i.e. the voltage imbalance is a measure of voltage differences between the phases.

Advantageously, embodiments of the present invention are valid for any wind turbine technologies, regardless of the wind turbine size, grid frequency and voltage at which it is connected, with following requisites: The wind turbine includes a power transformer on it, so that a power generation and output to the grid are done in different voltage levels. Furthermore, at both the low and high voltage sides, where the transformer is connected, the system cannot be a system with neutral isolated from earth. A third requisite is that the wind turbine has a line switch capable of interrupting the output line of the transformer with the possibility of being controlled with an external signal.

The term "high voltage" does not necessarily mean a voltage which is larger than a particular value, and the term "low voltage" does not necessarily mean a voltage which is smaller than a particular value. Instead, the terms "high voltage" and "low voltage" are to be understood that the high voltage is larger than the low voltage. The low voltage may have a value of about 690 V, while the high voltage may have a value of some kV, for example between 1 kV and 36 kV. The high voltage is sometimes designated also as "medium voltage".

In an embodiment, the detecting device further comprises a control device which is configured to open a line switch so as to interrupt an output line of the transformer based on the detected voltage and the detected current.

In an embodiment, the control device is configured to open the line switch if at least one of the following conditions occurs: an overvoltage is detected by the voltage detection device, an overcurrent is detected by the current detection device and a difference between a frequency at the low voltage side or the high voltage side and a respective target frequency exceeds a threshold value. In this respect, the voltage detection device also detects the frequency of the voltage at the first node at the low voltage side of the transformer, and/or the current detection device detects also the frequency of the current at the second node at the high voltage side of the transformer.

In an embodiment, the control device is configured to open the line switch if at least one of a phase overcurrent, a zero-sequence overcurrent and a negative sequence overcurrent is detected by the current detection device.

In an embodiment, the control device is configured to open the line switch if at least one of an undervoltage, a zero-sequence or neutral voltage and a Total Harmonic Distortion (THDv) over a defined level is detected by the voltage detection device.

In an embodiment, the control device is configured to open the line switch if an external trip signal is input into the control device. The external trip signal may either come from the control device of the same wind turbine, from another protection equipment installed in the wind turbine or from manual tripping.

In an embodiment, the detecting device further comprises a line switch which is arranged in the output line of the transformer behind the second node at the high voltage side.

According to a second aspect of embodiments of the invention, a wind turbine comprises a detecting device according to embodiments of the present invention.

According to a third aspect of embodiments of the invention, a method of detecting a fault in a transformer of a wind turbine is provided, wherein the transformer transforms a lower voltage, which is output from a generator of the wind turbine at a low voltage side of the transformer, to a higher voltage, which is output from the transformer at a high voltage side. The method comprises the following steps: a voltage detection step to detect a voltage at a first node at the low voltage side of the transformer; and a current detection step to detect a current at a second node at the high voltage side of the transformer. The method detects the fault in the transformer based on the detected voltage and the detected current. The controlling step opens the line switch in at least one of the following conditions: an open phase at the low voltage side if the voltage detection step detects a zero-sequence voltage or a zero-sequence voltage exceeding a particular threshold, and a voltage unbalance; and an open phase at the high voltage side if the voltage detection step detects no zero-sequence voltage or a zero-sequence voltage falling below a particular threshold, and a voltage unbalance.

In an embodiment, the method further comprises a controlling step to open a line switch so as to interrupt an output line of the transformer behind the second node based on the detected voltage and the detected current.

In an embodiment, the controlling step opens the line switch if at least one of the following conditions occurs: an overvoltage is detected in the voltage detection step, an overcurrent is detected in the current detection step and a difference between a frequency at the low voltage side or the high voltage side and a respective target frequency exceeds a threshold value.

In an embodiment, the controlling step opens the line switch if at least one of a phase overcurrent, a zero-sequence or neutral overcurrent and a negative sequence overcurrent is detected in the current detection step.

In an embodiment, the controlling step opens the line switch if at least one of an undervoltage, a zero-sequence or neutral voltage and a Total Harmonic Distortion (THDv) over a defined level is detected in the voltage detection step.

In an embodiment, the controlling step opens the line switch if an external trip signal is input.

The main components for realizing embodiments of the present invention are commercially available so that the solution according to embodiments of the present invention can be realized under low costs.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

BRIEF DESCRIPTION

Some of the embodiments will be described in detail, with reference to the following figures, wherein like designations denote like members, wherein.

DETAILED DESCRIPTION

Figure 1:
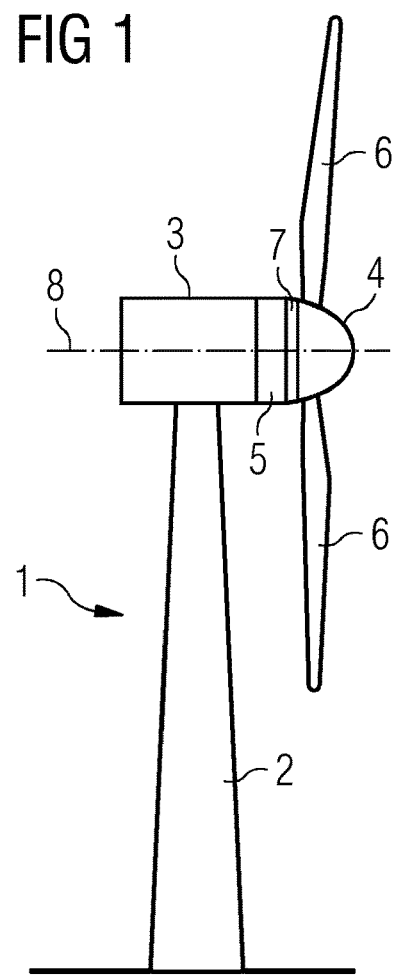
FIG. 1 shows a wind turbine and the different elements thereof.

The illustrations in the drawings are schematic. It is noted that in different figures, similar or identical elements are provided with the same reference signs.

FIG. 1 shows a wind turbine 1. The wind turbine 1 comprises a nacelle 3 and a tower 2. The nacelle 3 is mounted at the top of the tower 2. The nacelle 3 is mounted rotatable with regard to the tower 2 by a yaw bearing. The axis of rotation of the nacelle 3 with regard to the tower 2 is referred to as the yaw axis.

The wind turbine 1 also comprises a hub 4 with three rotor blades 6 (of which two rotor blades 6 are depicted in FIG. 1). The hub 4 is mounted rotatable with regard to the nacelle 3 by a main bearing 7. The hub 4 is mounted rotatable about a rotor axis of rotation 8.

The wind turbine 1 furthermore comprises a generator 5. The generator 5 in turn comprises a rotor connecting the generator 5 with the hub 4. The hub 4 is connected directly to the generator 5, thus the wind turbine 1 is referred to as a gearless, direct-driven wind turbine. Such a generator 5 is referred as direct drive generator 5. As an alternative, the hub 4 may also be connected to the generator 5 via a gear box. This type of wind turbine 1 is referred to as a geared wind turbine. Embodiments of the present invention are suitable for both types of wind turbines 1.

The generator 5 is accommodated within the nacelle 3. The generator 5 is arranged and prepared for converting the rotational energy from the hub 4 into electrical energy in the shape of an AC power.

Figure 2:
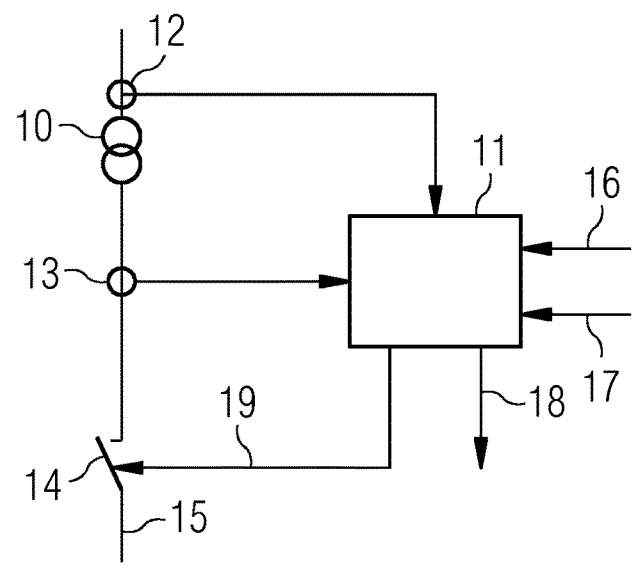
FIG. 2 shows a schematic circuit diagram including a detecting device according to an embodiment of the present invention.

FIG. 2 shows a schematic circuit diagram including a detecting device according to an embodiment of the present invention. The detecting device is usually arranged within the tower 2 and configured to detect a fault in a transformer 10 of the wind turbine 1. The transformer 10 is arranged within the nacelle 3. Embodiments of the invention are also applicable to a wind turbine where the transformer 10 is not arranged within nacelle 3, but within tower 2 or even on or in a base outside the wind turbine 1. The transformer 10 transforms a lower voltage, which is output from a generator 5 of the wind turbine 1 at a low voltage side of the transformer 10, to a higher voltage, which is output from the transformer 10 at a high voltage side.

The detecting device is arranged to detect a fault in the transformer 10 of the wind turbine 1. Such a fault can be an open phase at the low voltage side and/or at the high voltage side. The term "open phase" means an open circuit. Such faults may also include a short circuit such as a so called turn-to-turn fault at the low voltage side and/or at the high voltage side. The faults may also include a short circuit between a phase and the ground or a phase-to-phase short circuit at the low voltage side and/or the high voltage side.

If a fault is detected, a trip signal is output via a trip signal line 19 so as to trigger a line switch 14. The line switch 14 interrupts an output line 15 of the transformer 10. The line switch 14 can either be an independent switch or a back-up switch in addition to an existing switch.

The detecting device comprises a voltage detection device 11 configured to detect a voltage at a first node 12 at the low voltage side of the transformer 10, a current detection device 11 configured to detect a current at a second node 13 at the high voltage side of the transformer 10, and the line switch 14 which is arranged in the output line 15 of the transformer 10 behind the second node 13 at the high voltage side.

The detecting device further comprises a control device 11 configured to open the line switch 14 so as to interrupt the output line 15 of the transformer 10 based on the detected voltage and the detected current. The interruption of the output line 15 is performed if certain conditions are fulfilled as follows, which are discussed below.

The control device 11 is configured to open the line switch 14 if at least one of the following conditions occurs: an overvoltage is detected by the voltage detection device 11, an overcurrent is detected by the current detection device 11 and a difference between a frequency at the low voltage side or the high voltage side and a respective target frequency exceeds a threshold value. The overvoltage can be detected if the voltage at the low voltage side exceeds a first threshold value. The overcurrent can be detected if the current at the high voltage side exceeds a second threshold value.

If the frequencies need to be detected, the voltage detection device 11 detects not only the amplitude of the voltage but also the frequency of the voltage at the first node 12 at the low voltage side of the transformer 10, and/or the current detection device 11 detects not only the amplitude of the current but also the frequency of the current at the second node 13 at the high voltage side of the transformer 10.

In addition, the control device 11 is configured to open the line switch 14 if at least one of a phase overcurrent, a zero-sequence or neutral overcurrent and a negative sequence overcurrent is detected by the current detection device 11. These overcurrents can be detected if at least one of the phase current, the zero-sequence or neutral current and the negative sequence current at the high voltage side exceeds particular threshold values.

A zero-sequence or neutral current as a differential current can be calculated from the sum of the currents of all phases except the protective phase which lead into the electrical system, or it can be measured at one point of the electrical system as the vectorial sum of the currents of all active phases at this point. Such currents can occur, for example, as a result of insulation faults.

The negative sequence overcurrent is an indicator of asymmetrical faults for example in a three-phase electrical system Unsymmetrical faults may lead to unequal currents with unequal phase shifts in the three-phase system. The unsymmetrical faults may occur due to the presence of an open circuit or a short circuit within the transformer. The open circuit and the short circuit may lead to unsymmetrical faults in the transformer.

In addition, the control device 11 is configured to open the line switch 14 if at least one of an undervoltage, a zero-sequence or neutral voltage and a Total Harmonic Distortion (THDv) over a defined level is detected by the voltage detection device 11. The undervoltage can be detected if the voltage at the low voltage side falls below a third threshold value. The zero-sequence or neutral voltage can be detected if a value thereof exceeds a fourth threshold value.

The Total Harmonic Distortion (THDv) over a defined level can be detected and trigger a protection if a value thereof exceeds a fifth threshold value. The Total Harmonic Distortion (THDv) is an indicator of the harmonic distortion in a signal. The Total Harmonic Distortion (THDv) is defined as the ratio of the sum of the powers of all harmonic components to the power of the fundamental frequency.

In addition, the control device 11 is configured to open the line switch 14 if an external trip signal is input via an external trip signal line 17 into the control device 11. The external trip signal is generated by an external control means or an external controller (not shown).

The control device 11 is powered by a power supply line 16. The power supply line 16 can be fed by an Uninterrupted Power Supply (UPS). The control device 11 is connected to a data output line 18. The data output line 18 may include a communications bus and a digital output interface. A remote access to obtain information from the detecting device can be implemented, and diagnostic and forensic capabilities can be improved. Furthermore, the control device 11 is connected to a human-machine interface so that the control device 11 and the conditions for interruption can be configured to fulfil the user or customer requirements.

Figure 3:
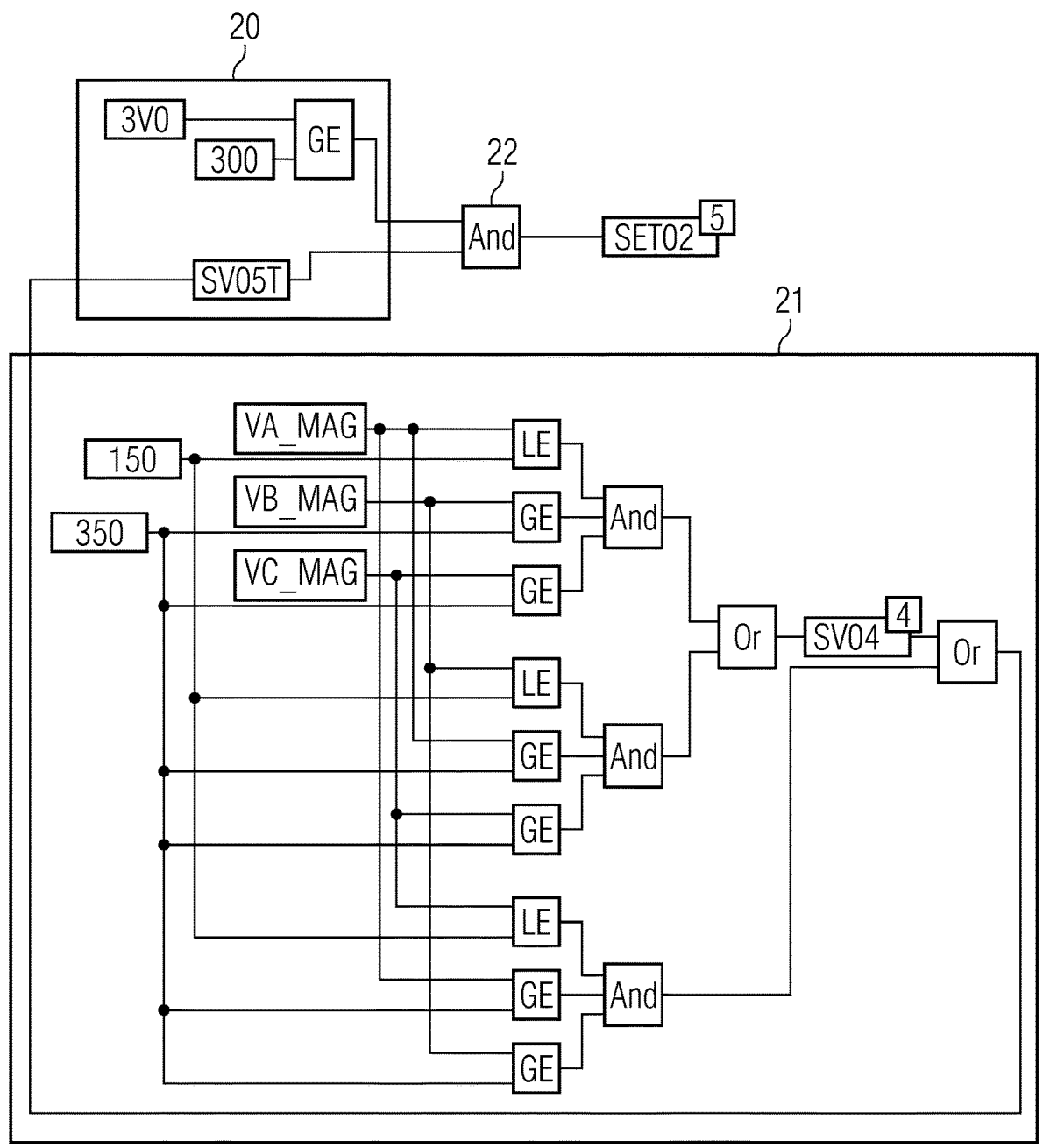
FIG. 3 shows a schematic logic circuit for controlling a line switch according to an embodiment of the present invention.

FIG. 3 shows a schematic logic circuit included in the control device 11 for controlling the line switch 14 according to an embodiment of the present invention. In this embodiment, an open phase at the low voltage side is detected. The logic circuit comprises a voltage unbalance detection block 21 a zero-sequence or neutral voltage detection block 20 and an AND gate 22. The control device 11 is configured to open the line switch 14 if the logic circuit detects an open phase at the low voltage side. This detection is made if the voltage detection device 11 detects a zero-sequence voltage exceeding a particular threshold value by the zero-sequence or neutral voltage detection block 20 and a voltage unbalance exceeding a particular threshold value by the voltage unbalance detection block 21.

Figure 4:
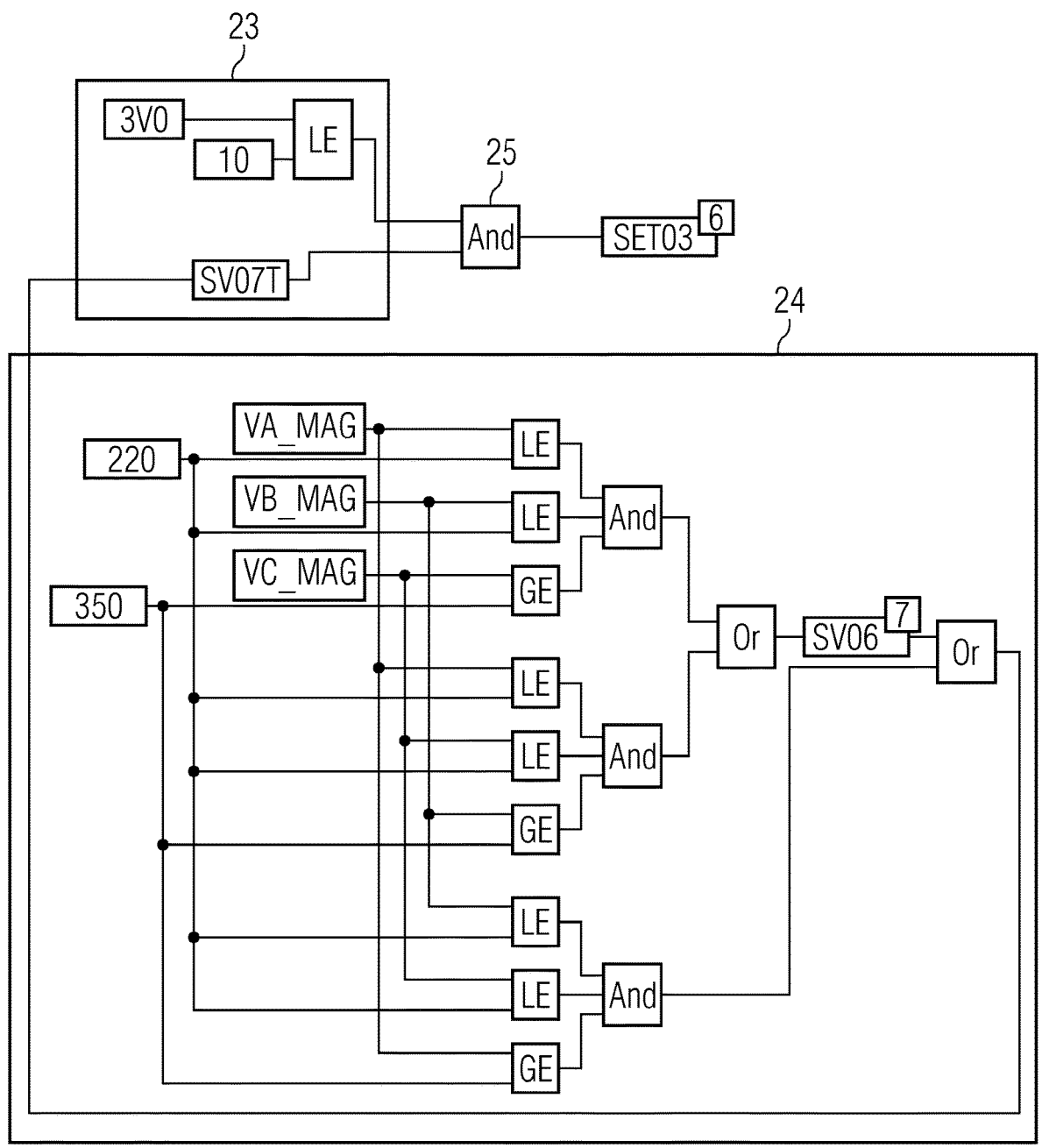
FIG. 4 shows a schematic logic circuit for controlling a line switch according to another embodiment of the present invention.

FIG. 4 shows a schematic logic circuit for controlling a line switch according to another embodiment of the present invention. In this embodiment, an open phase at the high voltage side is detected. The logic circuit comprises a voltage unbalance detection block 24, a zero-sequence voltage detection block 23 and an AND gate 25. The control device 11 is configured to open the line switch 14 if the logic circuit detects an open phase at the high voltage side. This detection is made if the voltage detection device 11 detects a zero-sequence voltage falling below a particular threshold value by the zero-sequence voltage detection block 23 and a voltage unbalance exceeding a particular threshold value by the voltage unbalance detection block 24.

The definitions and settings for tripping the line switch can be learned by modelling the wind turbine. The behavior of the wind turbine can be simulated using a specific simulation model. For some protections, the settings can be defined considering some safety factors over the envelope for the most restrictive (in time and in level) transitions and operating conditions of the wind turbine. A similar approach can be made for the High THDv protection.

The other logical protection algorithms may depend on the transformer characteristics: connection group, earthing system, etc.

A validation process of the settings may include the following steps:

Simulating the system by an advanced electrical simulation software using recently developed models for the transformer based on leakage reactances in special conditions;

Comparison with transformer manufacturer's detailed design models based on finite-element (FE) simulations;

Assessment by small-scale tests performed at manufacturer tests bench;

Final validation in real-scale tests and field operations.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A detecting device for detecting a fault in a transformer of a wind turbine, wherein the transformer transforms a lower voltage, which is output from a generator of the wind turbine at a low voltage side of the transformer, to a higher voltage, which is output from the transformer at a high voltage side, wherein the detecting device comprises:
a voltage detection device configured to detect a voltage at a first node at the low voltage side of the transformer;
a current detection device configured to detect a current at a second node at the high voltage side of the transformer; wherein the detecting device is configured to detect the fault in the transformer based on the detected voltage and the detected current; wherein the detecting device comprises a logic circuit, wherein the detecting device is configured to detect the fault in the transformer if the logic circuit detects at least one of the following conditions:
an open phase at the low voltage side if the voltage detection device detects a zero-sequence voltage exceeding a particular threshold and a voltage unbalance exceeding a particular threshold; and
an open phase at the high voltage side if the voltage detection device detects a zero-sequence voltage falling below a particular threshold and a voltage unbalance exceeding a particular threshold.

2. The detecting device according to claim 1, further comprising a control device configured to open a line switch so as to interrupt an output line of the transformer based on the detected voltage and the detected current.

3. The detecting device for detecting a fault in a transformer of a wind turbine according claim 1, wherein the detecting device is configured to detect the fault in the transformer if at least one of the following conditions occurs: an overvoltage is detected by the voltage detection device, an overcurrent is detected by the current detection device and a difference between a frequency at the low voltage side or the high voltage side and a respective target frequency exceeds a threshold value.

4. The detecting device for detecting a fault in a transformer of a wind turbine according to claim 1, wherein the detecting device is configured to detect the fault in the transformer if at least one of a phase overcurrent, a zero-sequence or neutral overcurrent and a negative sequence overcurrent is detected by the current detection device.

5. The detecting device for detecting a fault in a transformer of a wind turbine according to claim 1, wherein the detecting device is configured to detect the fault in the transformer if at least one of an undervoltage, a zero-sequence or neutral voltage and a Total Harmonic Distortion (THDv) over a defined level is detected by the voltage detection device.

6. The detecting device for detecting a fault in a transformer of a wind turbine according to claim 2, wherein the detecting device is configured to detect the fault in the transformer if an external trip signal is input into the control device.

7. The detecting device for detecting a fault in a transformer of a wind turbine according to claim 1, wherein the detecting device further comprises the line switch which is arranged in an output line of the transformer behind the second node at the high voltage side.

8. A wind turbine comprising a detecting device according to claim 1.

9. A method of detecting a fault in a transformer of a wind turbine wherein the transformer transforms a lower voltage, which is output from a generator of the wind turbine at a low voltage side of the transformer, to a higher voltage, which is output from the transformer at a high voltage side, the method comprising the following steps:
a voltage detection step to detect a voltage at a first node at the low voltage side of the transformer;
a current detection step to detect a current at a second node at the high voltage side of the transformer; and
a detecting step to detect the fault in the transformer based on the detected voltage and the detected current; wherein the detecting step detects the fault in the transformer in at least one of the following conditions:
an open phase at the low voltage side if the voltage detection step detects a zero-sequence voltage exceeding a particular threshold and a voltage unbalance exceeding a particular threshold; and
an open phase at the high voltage side if the voltage detection step detects a zero-sequence voltage falling below a particular threshold and a voltage unbalance exceeding a particular threshold.

10. The method according to claim 9, further comprising a controlling step to open a line switch so as to interrupt an output line of the transformer behind the second node based on the detected voltage and the detected current.

11. The method according to claim 9, wherein the detecting step detects the fault in the transformer if at least one of the following conditions occurs: an overvoltage is detected in the voltage detection step, an overcurrent is detected in the current detection step and a difference between a frequency at the low voltage side or the high voltage side and a respective target frequency exceeds a threshold value.

12. The method according to claim 9, wherein the detecting step detects the fault in the transformer if at least one of a phase overcurrent, a zero-sequence or neutral overcurrent and a negative sequence overcurrent is detected in the current detection step.

13. The method according to claim 9, wherein the detecting step detects the fault in the transformer if at least one of an undervoltage, a zero-sequence or neutral voltage and a Total Harmonic Distortion (THDv) over a defined level is detected in the voltage detection step.

14. The method according to claim 9, wherein the controlling step opens the line switch if an external trip signal is input.

* * * * *